(12) United States Patent
Zhang et al.

(10) Patent No.: US 9,296,608 B2
(45) Date of Patent: Mar. 29, 2016

(54) METHOD OF FORMING MEMS DEVICE

(71) Applicant: Shanghai Huahong Grace Semiconductor Manufacturing Corporation, Shanghai (CN)

(72) Inventors: Zhenxing Zhang, Shanghai (CN); Pei Xi, Shanghai (CN); Lei Xiong, Shanghai (CN)

(73) Assignee: SHANGHAI HUAHONG GRACE SEMICONDUCTOR MANUFACTURING CORPORATION, Shanghai (CN)

( * ) Notice: Subject to any disclaimer, the term of this patent is extended or adjusted under 35 U.S.C. 154(b) by 0 days.

(21) Appl. No.: 14/575,377

(22) Filed: Dec. 18, 2014

(65) Prior Publication Data

US 2015/0191348 A1    Jul. 9, 2015

(30) Foreign Application Priority Data

Jan. 9, 2014    (CN) .......................... 2014 1 0010413

(51) Int. Cl.
  *H01L 21/4763*    (2006.01)
  *B81C 1/00*    (2006.01)
  *H01L 21/768*    (2006.01)

(52) U.S. Cl.
  CPC ......... *B81C 1/00428* (2013.01); *B81C 1/00492* (2013.01); *H01L 21/76843* (2013.01); *H01L 21/76856* (2013.01); *H01L 21/76877* (2013.01)

(58) Field of Classification Search
  CPC ............ B81C 1/00428; B81C 1/00492; H01L 21/76843; H01L 21/76856; H01L 21/76877
  See application file for complete search history.

(56) References Cited

U.S. PATENT DOCUMENTS

| 6,495,452 B1 * | 12/2002 | Shih ............................. 438/643 |
| 2010/0022030 A1 * | 1/2010 | Ditizio ............................ 438/3 |
| 2011/0049589 A1 * | 3/2011 | Chuang et al. ................ 257/292 |

* cited by examiner

*Primary Examiner* — Su C Kim
(74) *Attorney, Agent, or Firm* — Muncy, Geissler, Olds & Lowe, P.C.

(57) ABSTRACT

A method of forming a micro-electro-mechanical systems device includes: providing a substrate; sequentially forming a tantalum nitride (TaN) layer and a hard mask layer on the substrate, the hard mask layer having a thickness larger than a thickness of the TaN layer; coating photoresist on the hard mask layer, patterning the photoresist and performing a first etching process on the hard mask layer with the photoresist serving as a mask to form an opening in the hard mask layer, wherein a portion of the thickness of the hard mask layer is remained under the opening; removing the photoresist; and performing a second etching process to remove the portion of the thickness of the hard mask layer under the opening as well as a portion of the TaN layer under the opening to form a trench.

9 Claims, 2 Drawing Sheets

METHOD OF FORMING MEMS DEVICE

CROSS-REFERENCES TO RELATED APPLICATIONS

This application claims the priority of Chinese patent application number 201410010413.8, filed on Jan. 9, 2014, the entire contents of which are incorporated herein by reference.

TECHNICAL FIELD

The present invention relates generally to micro-electromechanical systems (MEMS), and in particular, to a method of forming a MEMS device.

BACKGROUND

MEMS devices are micro-machined devices or systems, generally of a micron or nanometer size and incorporating integrated micro-sized sensors, actuators, signal processors, control circuitry and other like components. Thanks to their small size, lightweight, low power consumption, low price, reliable performance and other advantages, MEMS devices have found extensive use in a variety of applications.

MEMS is a new high-end technology emerging in recent years and developing rapidly. Based on advanced semiconductor fabrication technology, MEMS devices can be massively produced with well-controlled production costs and high product consistency. Typical fabrication process of MEMS devices is a micromachining process that involves film deposition, photolithography, epitaxy, oxidation, diffusion, injection, sputtering, evaporation, etching, dicing, packaging and other necessary steps for fabricating complex three-dimensional structures. In these steps, film deposition, photolithography and etching are most critical for the fabrication process of MEMS devices.

FIG. 1 shows a conventional MEMS device, generally designated by the numeral 10. MEMS device 10 includes a substrate 11, a nickel-iron (NiFe) layer 12 formed on the substrate 11, a tantalum nitride (TaN) layer 13 formed on the NiFe layer 12 and a trench 14 formed in the TaN layer 13.

Principal steps of forming the MEMS device 10 include: providing the substrate 11 and successively forming thereon the NiFe layer 12 and TaN layer 13; and coating a photoresist on the TaN layer 13 and performing photolithographic and etching processes to form the trench 14 in the TaN layer 13. Obviously, the photoresist acts as an etching mask herein for the TaN layer 13 during the formation of trench 14.

However, etching of the TaN layer 13 tends to generate a great amount of polymeric substances which will react with the photoresist disposed on the surface of the TaN layer 13 and hence yields tantalum-containing polymeric products in a large amount. Such resulting polymeric substances contain, in addition to tantalum, carbon, hydrogen and other elements that are hard to be removed and will remain as a deposit in the formed trench. This will reshape the vertical walls of the trench 14 into sloped surfaces. As shown in FIG. 1, the opposing side faces of the remainders of the etched TaN layer 13, which form the walls of the trench 14, are both inclined at an angle (a) of generally 50° to 60° with respect to the respective bottoms thereof. Such sloped walls require the trench 14 to have a larger width at the top edges, which is detrimental to the performance of the MEMS device being fabricated.

Therefore, there is an urgent need in this art for a solution to address the performance degradation of the conventional MEMS device caused by the residues of tantalum-containing polymeric substances generated during the etching process for the TaN layer.

SUMMARY OF THE INVENTION

It is therefore an objective of the present invention to provide a method of forming a MEMS device to address the above described problem.

In accordance with this objective, the method of the present invention includes the following steps in the sequence set forth: providing a substrate; sequentially forming a tantalum nitride layer and a hard mask layer on the substrate, the hard mask layer having a thickness larger than a thickness of the tantalum nitride layer; coating a photoresist on the hard mask layer, patterning the photoresist and performing a first etching process on the hard mask layer with the photoresist serving as an etching mask to form an opening in the hard mask layer, wherein a depth of the opening is smaller than a thickness of the hard mask layer such that a portion of the thickness of the hard mask layer is remained under the opening; removing the photoresist; and performing a second etching process to remove the portion of the thickness of the hard mask layer under the opening as well as a portion of the tantalum nitride layer under the opening to form a trench.

Optionally, the hard mask layer may be a silicon nitride layer.

Optionally, the silicon nitride layer may be formed by a chemical vapor deposition process.

Optionally, a thickness of the silicon nitride layer may be larger than three times a thickness of the tantalum nitride layer.

Optionally, the portion of the thickness of the silicon nitride layer remaining under the opening after the first etching process may range from 100 Å to 300 Å.

Optionally, the first and second etching processes may both involve a plasma etching process.

Optionally, the method may further include performing an ashing process and a wet cleaning process on the trench after the second etching process.

Optionally, the method may further include forming a nickel-iron layer on the substrate prior to forming the tantalum nitride layer and after providing the substrate.

Optionally, the nickel-iron layer and the tantalum nitride layer may be both formed by a physical vapor deposition process.

By forming the trench using two etching processes, i.e., a first etching process for etching away a portion of a thickness of the hard mask layer so as to allow the remaining portion thereof to isolate the tantalum nitride layer from the photoresist and a second etching process in which the remaining portion of the hard mask layer serves as a mask for etching the underlying tantalum nitride layer, the method of the present invention circumvents the problem of residues of tantalum-containing polymeric substances arising when etching the tantalum nitride layer directly using the photoresist as a mask.

DETAILED DESCRIPTION

The method of forming an MEMS device according to the present invention will be described in greater detail with reference to the following description of an exemplary embodiment, taken in conjunction with the accompanying drawings. Features and advantages of the invention will be apparent from the following detailed description, and from the claims. It is noted that all the drawings are presented in a very simple form and not drawn precisely to scale. They are provided solely to facilitate the description of the exemplary embodiment in a convenient and clear way.

Figure 1:
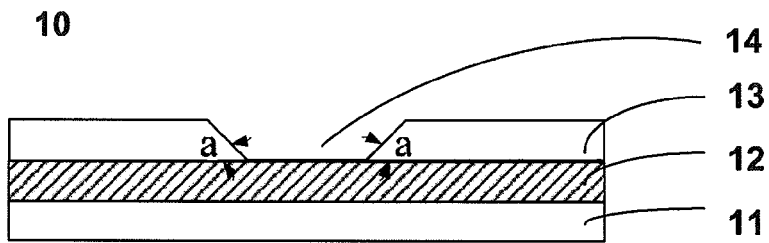
FIG. 1 is a schematic illustrating a conventional MEMS device.
Figure 2:
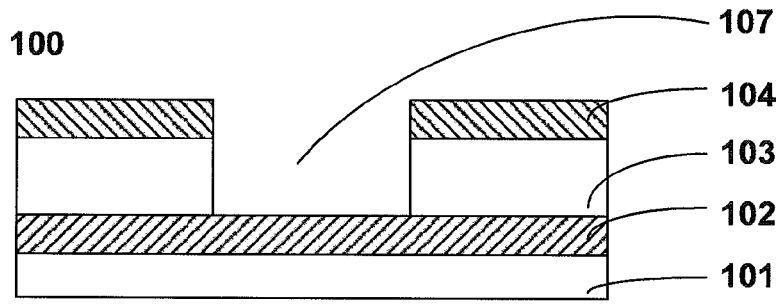
FIG. 2 schematically depicts a MEMS device constructed in accordance with an embodiment of the present invention.

FIG. 2 is a schematic illustration of a MEMS device in accordance with an embodiment of the present invention. In this embodiment, the MEMS device is fabricated by a method including the steps of:

S10) providing a substrate 101;

S11) sequentially forming a tantalum nitride (TaN) layer 103 and a hard mask layer 104 on the substrate 101;

S12) coating a photoresist 105 on the hard mask layer 104, patterning the photoresist 105 and performing a first etching process on the hard mask layer 104 with the photoresist 105 serving as an etching mask to form an opening 106 in the hard mask layer 104, wherein a depth of the opening 106 is smaller than a thickness of the hard mask layer 104 such that a portion of the thickness of the hard mask layer 104 is remained under the opening 106;

S13) removing the photoresist 105; and

S14) performing a second etching process to remove the portion of the thickness of the hard mask layer 104 under the opening 106 as well as a portion of the TaN layer 103 under the opening 106 to form a trench 107.

Figure 3:
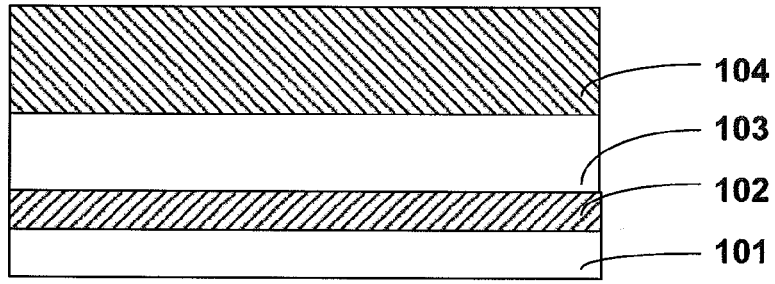
FIG. 3 shows a resulting structure after the formation of a silicon nitride layer in a method for forming the MEMS device in accordance with the embodiment of the present invention.

In particular, as shown in FIG. 3, the substrate 101 may be provided as a semiconductor substrate such as an n-type, p-type or silicon on insulator (SOI) substrate.

A physical vapor deposition (PVD) process may be employed to form a nickel-iron (NiFe) layer 102 on the substrate 101, followed by another PVD process to form the TaN layer 103 on the NiFe layer 102. Afterward, the hard mark layer 104 is formed on the TaN layer 103. FIG. 3 shows a structure resulting from the formation of the hard mark layer 104 in the method for fabricating the MEMS device in accordance with this embodiment. To prevent the hard mark layer 104 from being entirely etched away in a subsequent step for etching the underlying TaN layer 103, the hard mark layer 104 may be generally thicker than the TaN layer 103.

In this embodiment, the hard mark layer 104 is formed of silicon nitride by an existing CVD process. It is required that a thickness of the silicon nitride layer formed by CVD is over three times a thickness of the TaN layer 103. As the TaN layer 103 is generally designed to have a thickness of 600 Å in the fabrication of MEMS devices, the silicon nitride layer is required to have a thickness of over 1800 Å. Preferably, the thickness of the silicon nitride layer is 2000 Å, 2200 Å, 2400 Å, 2600 Å, or 2800 Å. With a thickness of over three times the thickness of the TaN layer 103, the silicon nitride layer is ensured not to be totally etched away during the subsequent etching step.

Figure 4:
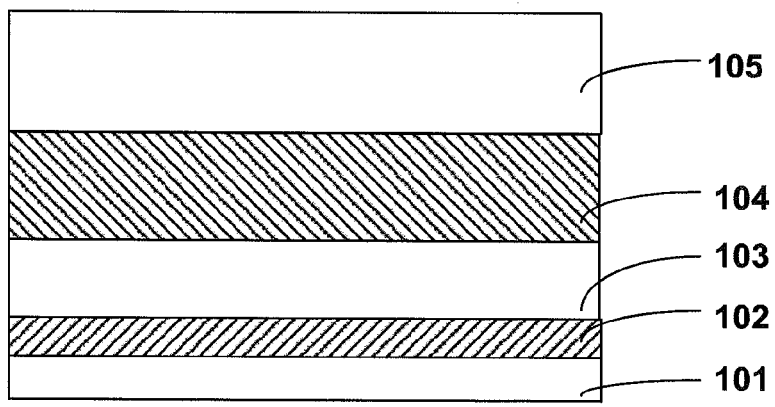
FIG. 4 shows the structure prior to a first etching process in the method in accordance with the embodiment of the present invention.
Figure 5:
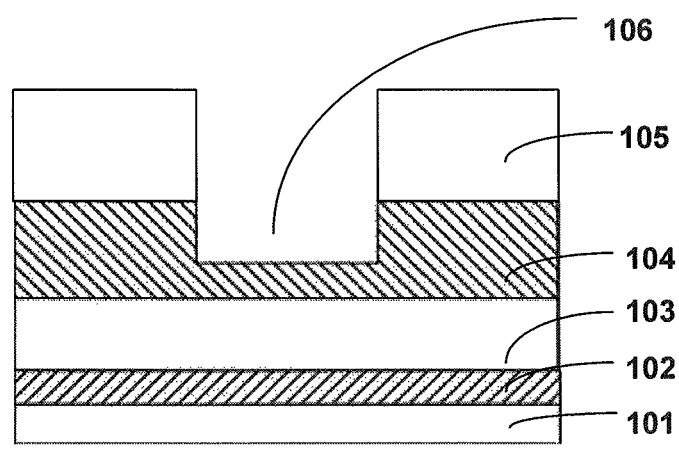
FIG. 5 shows the structure after the first etching process in the method in accordance with the embodiment of the present invention.

Referring to FIGS. 4 and 5, the hard mark layer 104 is then coated with photoresist 105 and the photolithographic process is performed thereon. With the completion of the photolithographic process, the first etching process, which is implemented as an existing plasma etching process, is performed on the hard mark layer 104. FIGS. 4 and 5 show the structure prior to and after the first etching process, respectively, in the method in accordance with this embodiment. As illustrated in FIG. 4, before the first etching process, the hard mark layer 104 bears the photoresist 105 with a desired pattern transferred therein by the photolithographic process. After the first etching process, the pattern is further transferred in the hard mark layer 104, thus forming the opening 106 therein, wherein the portion of the hard mark layer 104 under the opening 106 is not totally etched away and a certain thickness of hard mark layer 104 is remained covering the underlying TaN layer 103, as shown in FIG. 5. More particularly, due to the first etching process, the portion of the hard mark layer 104 under the opening 106 is subjected to thickness reduction but still keeps a certain thickness, while the rest portion of the hard mark layer 104 is not affected and its thickness is not reduced. Therefore, in the first etching process, the hard mark layer 104 is only partially etched, and after the first etching process, there is still a portion of the thickness of the hard mark layer 104 remained under the formed opening 106. In this embodiment, the remaining portion of the thickness of the hard mark layer 104 under the opening 106 is generally required to be from 100 Å to 300 Å.

Figure 6:
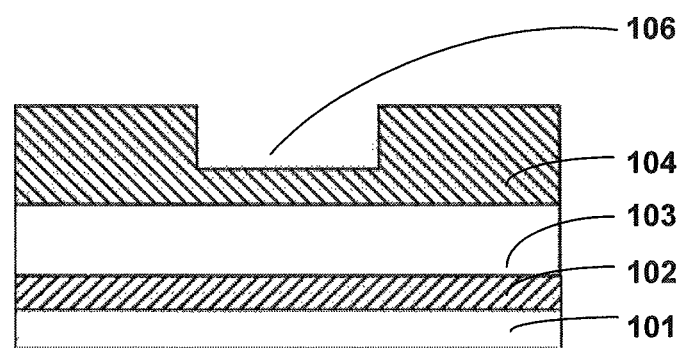
FIG. 6 shows the structure after a second etching process in the method in accordance with the embodiment of the present invention.

Referring to FIG. 6, with the completion of the first etching process, the photoresist 105 is removed from the surface of the hard mark layer 104 and the second etching process, which is also implemented as an existing plasma etching process, is further performed on both the hard mark layer 104 and the underlying TaN layer 103. FIG. 6 shows the structure after the second etching process in the method in accordance with this embodiment. Referring again to FIG. 2, in the second etching process, the remaining portion of the hard mark layer 104 under the opening 106 is entirely etched away, exposing the underlying TaN layer 103, and the etching further proceeds with the hard mark layer 104 acting as a mask until the exposed portion of the TaN layer 103 is removed and the NiFe layer 102 is exposed, thus forming the trench 107. During the formation of the trench 107, the rest portion of the hard mark layer 104 other than the portion under the opening 106 is further thinned. However, because of the relatively large thickness of the hard mark layer 104, after the second etching process is completed and the trench 107 is formed, the remaining portion of the TaN layer 103 is still covered by the hard mark layer 104. Therefore, it is clear that during the second etching process, the remaining portion of the hard mark layer 104 under the opening 106 and the portion of the TaN layer 103 under the opening 106 are etched away.

After these steps, the formed MEMS device with the trench formed therein may be further subjected to ashing and wet cleaning processes for remove various residues attached thereto.

By forming a silicon nitride layer on the TaN layer, transferring the desired pattern in the silicon nitride layer, removing the photoresist before the TaN layer is etched, and etching the TaN layer with the overlying silicon nitride layer serving as an etching mask, the method of the present invention prevents the generation of tantalum-containing polymeric substances from a reaction between the TaN layer and the photoresist during the etching process. It has been proven by practical tests that while angles of side faces of the etched TaN layer with respect to the bottoms thereof formed in accordance with the present invention are not exactly right angles, they are both general over 65°, larger than those of the conventional MEMS devices. Thus, the inventive method is capable of forming a trench with an improved shape with steeper walls and larger wall-to-bottom angles.

As described above, through forming a silicon nitride layer on the TaN layer and etching the TaN layer with the silicon nitride layer acting as a mask, the method of the present invention can address the problem of residues of tantalum-containing polymeric substances arising when the TaN layer is directly etched, and can hence result in an improvement both in trench shape and MEMS device performance.

While a preferred embodiment has been illustrated and described above, it should be understood that they are not intended to limit the invention in any way. It is also intended that the appended claims cover all variations and modifications made in light of the above teachings by those of ordinary skill in the art.

What is claimed is:

1. A method of forming a micro-electro-mechanical systems (MEMS) device, comprising the following steps in the sequence set forth:

providing a substrate;

sequentially forming a tantalum nitride layer and a hard mask layer on the substrate, the hard mask layer having a thickness larger than a thickness of the tantalum nitride layer;

coating a photoresist on the hard mask layer, patterning the photoresist and performing a first etching process on the hard mask layer with the photoresist serving as an etching mask to form an opening in the hard mask layer, wherein a depth of the opening is smaller than a thickness of the hard mask layer such that a portion of the thickness of the hard mask layer is remained under the opening;

removing the photoresist; and performing a second etching process to remove the portion of the thickness of the hard mask layer under the opening as well as a portion of the tantalum nitride layer under the opening to form a trench without using photoresist as an etching mask.

2. The method of claim 1, wherein the hard mask layer is a silicon nitride layer.

3. The method of claim 2, wherein the silicon nitride layer is formed by a chemical vapor deposition process.

4. The method of claim 3, wherein a thickness of the silicon nitride layer is larger than three times a thickness of the tantalum nitride layer.

5. The method of claim 4, wherein the portion of the thickness of the silicon nitride layer remaining under the opening after the first etching process ranges from 100 Å to 300 Å.

6. The method of claim 1, wherein the first and second etching processes both involve a plasma etching process.

7. The method of claim 1, further comprising performing an ashing process and a wet cleaning process on the trench after the second etching process.

8. The method of claim 1, further comprising forming a nickel-iron layer on the substrate prior to forming the tantalum nitride layer and after providing the substrate.

9. The method of claim 8, wherein the nickel-iron layer and the tantalum nitride layer are both formed by a physical vapor deposition process.

* * * * *